US008843323B1

(12) United States Patent
Nelson

(10) Patent No.: US 8,843,323 B1
(45) Date of Patent: Sep. 23, 2014

(54) METHOD FOR COMPUTING SELF-CONSISTENT SOLUTION IN A GUN CODE

(75) Inventor: Eric M. Nelson, White Rock, NM (US)

(73) Assignee: Los Alamos National Security, LLC, Los Alamos, NM (US)

(*) Notice: Subject to any disclaimer, the term of this patent is extended or adjusted under 35 U.S.C. 154(b) by 1167 days.

(21) Appl. No.: 12/780,776

(22) Filed: May 14, 2010

(51) Int. Cl.
*G06F 19/00* (2011.01)

(52) U.S. Cl.
USPC ............. 702/28; 250/307; 250/310; 250/309; 250/398

(58) Field of Classification Search
USPC .................... 702/28; 250/307, 310, 309, 398
See application file for complete search history.

(56) References Cited

U.S. PATENT DOCUMENTS 5,302,828 A * 4/1994 Monahan .................. 250/307

OTHER PUBLICATIONS

Nelson et al., Current Accumulation for a Self Magnetic Field Calculation in a Finite-Element Gun Code, IEEE Transactions on Magnetics 41:2355-2361 (2005).
Nelson et al., An Analysis of the Basic Space-Charge-Limited Emission Algorithm in a Finite-Element Electrostatic Gun Code, IEEE Transactions on Plasma Science 32:1223-1235 (2004).
Petillo et al., Recent Developments to the MICHELLE 2-D/3-D Electron Gun and Collector Modeling Code, IEEE Transactions on Electron Devices 52:742-748 (2005).
Petillo et al., The MICHELLE Three-Dimensional Electron Gun and Collector Modeling Tool: Theory and Design, IEEE Transactions on Plasma Science 30:1238-1264 (2002).
Nelson et al., Demystifying Relaxation in the Gun Code Algorithm, IEEE 2010, Vacuum Electronics Conference, May 18-20, 2010 (2 pages).

* cited by examiner

*Primary Examiner* — Jonathan C Teixeira Moffat
*Assistant Examiner* — Hien Vo
(74) *Attorney, Agent, or Firm* — Klarquist Sparkman, LLP

(57) ABSTRACT

Complex gun code computations can be made to converge more quickly based on a selection of one or more relaxation parameters. An eigenvalue analysis is applied to error residuals to identify two error eigenvalues that are associated with respective error residuals. Relaxation values can be selected based on these eigenvalues so that error residuals associated with each can be alternately reduced in successive iterations. In some examples, relaxation values that would be unstable if used alone can be used.

20 Claims, 9 Drawing Sheets

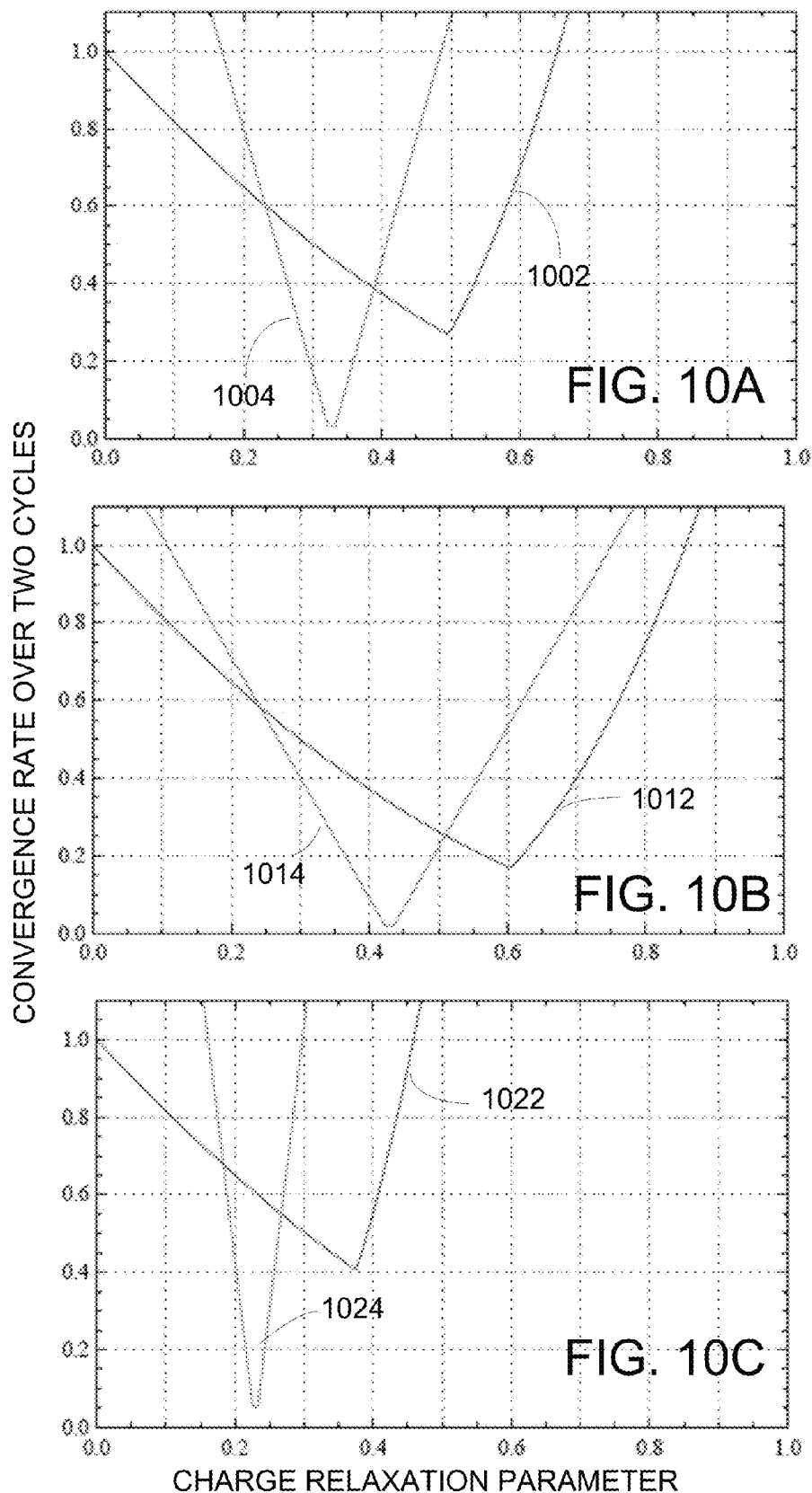

METHOD FOR COMPUTING SELF-CONSISTENT SOLUTION IN A GUN CODE

GOVERNMENT LICENSE RIGHTS

The United States government has rights in this invention pursuant to Contract No. DE-AC52-06NA25396 between the United States Department of Energy and Los Alamos National Security, LLC for the operation of Los Alamos National Laboratory.

FIELD

The disclosure pertains to characterization of charged particle beam emission structures using gun codes.

BACKGROUND

Although solid state electronic devices dominate many electronic applications, high frequency applications such as microwave communications and radar still take advantage of electron beam devices. Such devices can be configured to provide considerable power amplification at frequencies of up to 100-300 GHz. Typical examples include travelling wave tubes (TWTs) that can be used for satellite communication or for power amplification in radar systems.

Effective design of electron beam devices generally requires determination of beam currents and beam spatial distribution based on applied electric and magnetic fields, as well as the electric and magnetic fields produced by the beam itself. While these calculations can be performed with the assistance of a computer, the calculations are time consuming even with powerful processors. Thus, device designers can be limited in their ability to adequately characterize a selected device design and determine if design implementations perform as intended. Moreover, design variations and alternative designs may prove too compute-intensive to evaluate, and superior designs even in a design space that is otherwise limited may remain unidentified.

SUMMARY

Representative methods include establishing first values for a plurality of node potentials or ray currents defined with respect to a charged particle beam emission structure. Based on the first values and a first relaxation value, second values are determined for the plurality of node potentials or ray currents based on a gun code. Based on the second values, a second relaxation value that is different from the first relaxation value, and the gun code, third values for the plurality of node potentials or ray currents are determined, wherein the first and second relaxation values are different. In some examples, the first relaxation value and the second relaxation value are based on eigenvalues associated with error residuals. In other examples, the first relaxation value or the second relaxation value is associated with charge relaxation and has a value of about 1. In still further examples, the first and second relaxation values are associated with charge relaxation, and the method further includes performing an error residual eigenvalue determination, and selecting the first relaxation value and the second relaxation value based on eigenvalues associated with error residuals. In other representative examples, a combined charge relaxation value is determined that is associated with approximately equal reductions in error residual contributions associated with eigenvectors corresponding to the first and second relaxation values. In still other embodiments, values for the plurality of node potentials or ray currents are determined based on the combined charge relaxation value and the gun code. In still other examples, node potentials or ray currents are determined by iterative application of the gun code and alternate application of the first relaxation value and the second relaxation value. In other examples, iterative node potentials or ray currents are determined based on a first value and a second value of an emission relaxation parameter, wherein the first emission relaxation value and the second emission relaxation value can be different. According to other alternatives, at least some of the node potentials or ray currents or relaxation parameters are displayed on a display device or stored in computer readable storage medium.

Computer readable storage medium are provided having stored thereon computer-executable instructions for performing a method that includes determining eigenvalues associated with error residuals in an evaluation of a charged particle beam emission structure using a gun code. The method also includes associating the eigenvalues with at least a first group of eignenvalues and a second group of eigenvalues, and determining a combined charge relaxation value based on the first and second groups of eigenvalues. The combined charge relaxation value is selected so as to reduce error residuals associated with the first and second groups of eigenvalues substantially equally in a gun code iteration.

Computer readable storage medium are disclosed having stored thereon computer-executable instructions for performing a method that includes determining error residuals associated with a first eigenvalue and a second eigenvalue and associated with estimation of node voltages or ray currents for a charged particle beam emission structure based on a gun code. A first relaxation parameter and a second relaxation parameter are selected based on the determination. In other examples, the instructions are associated with iteratively determining node potentials or ray currents defined with respect to a charged particle beam emission structure based on the first relaxation parameter and the second relaxation parameter. In further examples, node potentials or ray currents defined with respect to a charged particle beam emission structure are iteratively determined by alternately applying the first relaxation parameter and the second relaxation parameter to the iterations. In some examples, the relaxation values are associated with charge relaxation, emission relaxation, or both. In other examples, one of the first and second relaxation values is about 1. According to other examples, the method further comprises determining a combined charge relaxation value associated with approximately equal reductions in error residual contributions associated with eigenvectors corresponding to the first and second relaxation values. In further examples, node potentials or ray currents are determined based on the combined charge relaxation value and the gun code. In other examples, the method further comprises determining if a mesh size for the node potential or ray current has been changed, and if so, updating only one of the relaxation parameter values.

Other methods comprise displaying a user interface configured for selecting at least two relaxation parameters associated with electromagnetic field distributions in a charged particle beam emission structure, and estimating the electromagnetic field distributions using a gun code and the selected relaxation parameters. In some examples, the user interface includes display regions associated with each of the at least two relaxation values, and configured to receive parameter values at the display regions. According to some examples, the user interface includes a display region associated with an indication that at least one of the two relaxation parameters is to be determined by an eigenvector analysis or scaling.

These and other features and aspects of the disclosed technology are set forth below with reference to the accompanying drawings.

BRIEF DESCRIPTION OF THE DRAWINGS

FIGS. 10A-10C illustrate convergence using a single r-value and alternating r-values.

DETAILED DESCRIPTION

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Computer Environment

Figure 1:
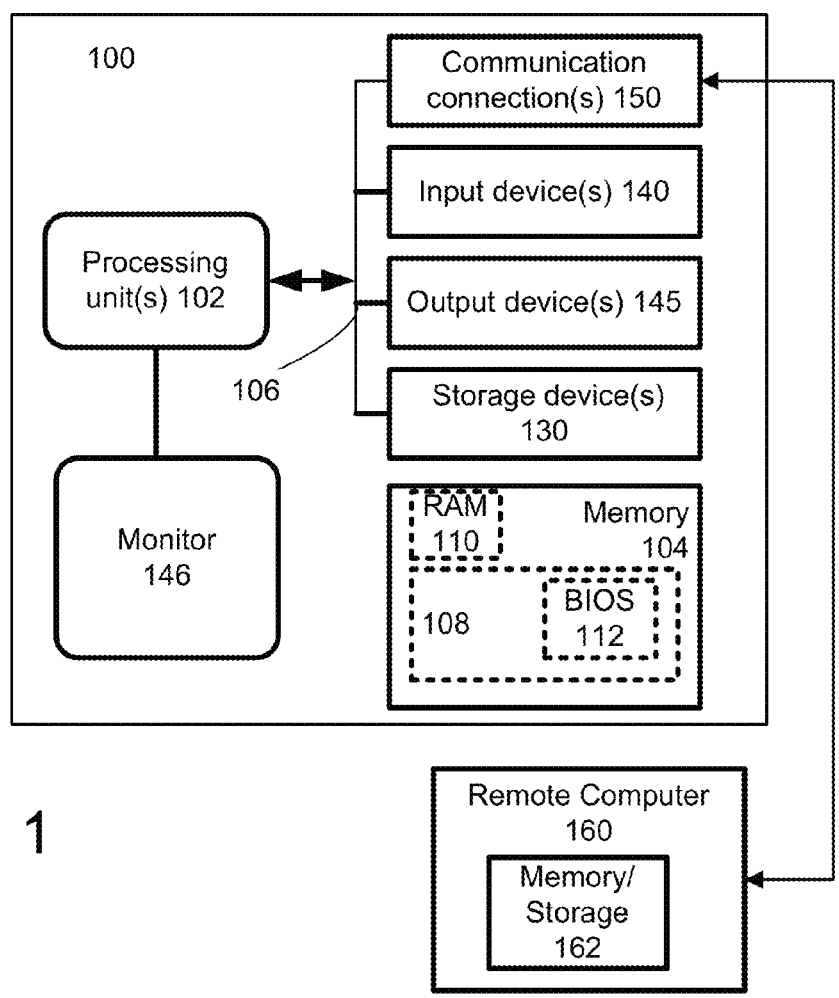
FIG. 1 is a diagram illustrating a representative computer environment for the disclosed methods.

FIG. 1 and the following discussion are intended to provide a brief, general description of an exemplary computing environment in which the disclosed technology may be implemented. Although not required, the disclosed technology is described in the general context of computer-executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand-held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 1, an exemplary system for implementing the disclosed technology includes a general purpose computing device in the form of an exemplary conventional PC 100, including one or more processing units 102, a system memory 104, and a system bus 106 that couples various system components including the system memory 104 to the one or more processing units 102. The system bus 106 may be any of several types of bus structures including a memory bus or memory controller, a peripheral bus, and a local bus using any of a variety of bus architectures. The exemplary system memory 104 includes read only memory (ROM) 108 and random access memory (RAM) 110. A basic input/output system (BIOS) 112, containing the basic routines that help with the transfer of information between elements within the PC 100, is stored in ROM 108.

The exemplary PC 100 further includes one or more storage devices 130 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 106 by a hard disk drive interface, a magnetic disk drive interface, and an optical drive interface, respectively. The drives and their associated computer-readable media provide nonvolatile storage of computer-readable instructions, data structures, program modules, and other data for the PC 100. Other types of computer-readable media which provide non-transitory storage of data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 130 including an operating system, one or more application programs, other program modules, and program data. A user may enter commands and information into the PC 100 through one or more input devices 140 such as a keyboard and a pointing device such as a mouse. Other input devices may include a digital camera, microphone, joystick, game pad, satellite dish, scanner, or the like. These and other input devices are often connected to the one or more processing units 102 through a serial port interface that is coupled to the system bus 106, but may be connected by other interfaces such as a parallel port, game port, or universal serial bus (USB). A monitor 146 or other type of display device is also connected to the system bus 106 via an interface, such as a video adapter. Other peripheral output devices, such as speakers and printers (not shown), may be included.

The PC 100 may operate in a networked environment using logical connections to one or more remote computers, such as a remote computer 160. In some examples, one or more network or communication connections 150 are included. The remote computer 160 may be another PC, a server, a router, a network PC, or a peer device or other common network node, and typically includes many or all of the elements described above relative to the PC 100, although only a memory storage device 162 has been illustrated in FIG. 1. The personal computer 100 and/or the remote computer 160 can be connected to a logical a local area network (LAN) and a wide area network (WAN). Such networking environments are commonplace in offices, enterprise-wide computer networks, intranets, and the Internet.

When used in a LAN networking environment, the PC 100 is connected to the LAN through a network interface. When used in a WAN networking environment, the PC 100 typically includes a modem or other means for establishing communications over the WAN, such as the Internet. In a networked environment, program modules depicted relative to the personal computer 100, or portions thereof, may be stored in the remote memory storage device or other locations on the LAN or WAN. The network connections shown are exemplary, and other means of establishing a communications link between the computers may be used.

Gun Code Calculations

Most gun codes employ a relaxation method to compute the self-consistent solution of Poisson's equation with charged particle beam emission and transport. One or more relaxation parameters are used so that the computation converges, and the convergence rate depends on relaxation parameter values. However, as the complexity of gun code calculations has increased due to, for example, the modeling of sheet beam devices, computation times have become substantial, especially if 3-D self-magnetic fields are to be computed. In addition, the use of finer meshes has increased, and relaxation parameters have been established based on those used for coarser meshes. These conventional values are poor choices for fine meshes. Described herein are representative methods of selecting relaxation parameters and performing gun code calculations that can more accurately determine electromagnetic fields and currents in reduced computation times. As used herein, gun code refers to computer executable instructions for finite element or finite difference based self-consistent electromagnetic field and/or current determinations in charged particle beam structures. Such gun codes are described in, Nelson et al., "Current Accumulation for a Self Magnetic Field Calculation in a Finite-Element Gun Code," IEEE Trans. Magn. 41:2355-2361 (August 2005), Petillo et al., "The MICHELLE Three-Dimensional Electron Gun and Collector Modeling Tool: Theory and Design," IEEE Trans. Plasma Science 30:1238-1264 (June 2002), and Petillo et al., "Recent Developments to the MICHELLE 2-D/3-D Electron Gun and Collector Modeling Code," IEEE Trans. Electron Devices 52:742-748 (May 2005), all of which are incorporated herein by reference.

Node potentials and emitted ray currents are generally determined iteratively based on a selected structured or unstructured spatial mesh having a plurality of nodes, and mesh sizes can be selected as needed. With $i^{th}$ cycle node potentials $\phi_i$ and emitted ray currents $I_i$, node potentials and emitted ray currents for an $(i+1)^{th}$ iteration can be determined based on the following:

$$P\phi_{i+1} = rQR(I_i, \phi_i) + rQ_d + (1-r)P\phi_i \quad (1)$$

$$I_{i+1} = sE(\phi_{i+1}) + (1-s)I_i, \quad (2)$$

wherein $P\phi_2 = Q_d$ and $I_1 = 0$ for a first cycle. $P\phi$ is a discretized Laplacian operator which can be represented as a matrix acting on an vector of interior node potentials, $QR(I, \phi)$ is charge accumulated to the nodes for rays traced through a structure under investigation from an emission point, $E(\phi)$ is an algorithm describing charge emission, $Q_d$ is charge from Dirichlet boundary conditions, and s and r are an emission relaxation parameter and a charge relaxation parameter, respectively. The right hand side of the Equation (1) above corresponds to discretized charge density, and Equation (1) is a discretized Poisson equation. As used herein, a charge relaxation parameter is a relaxation parameter applied to this discretized charge density produced by $i^{th}$ iteration values in determining $(i+1)^{th}$ node potentials. An emission relaxation parameter is associate with estimation of $(i+1)^{th}$ ray currents based on node potentials in an $(i+1)^{th}$ iteration and ray currents in an $i^{th}$ iteration as well as the emission algorithm.

Figure 2:
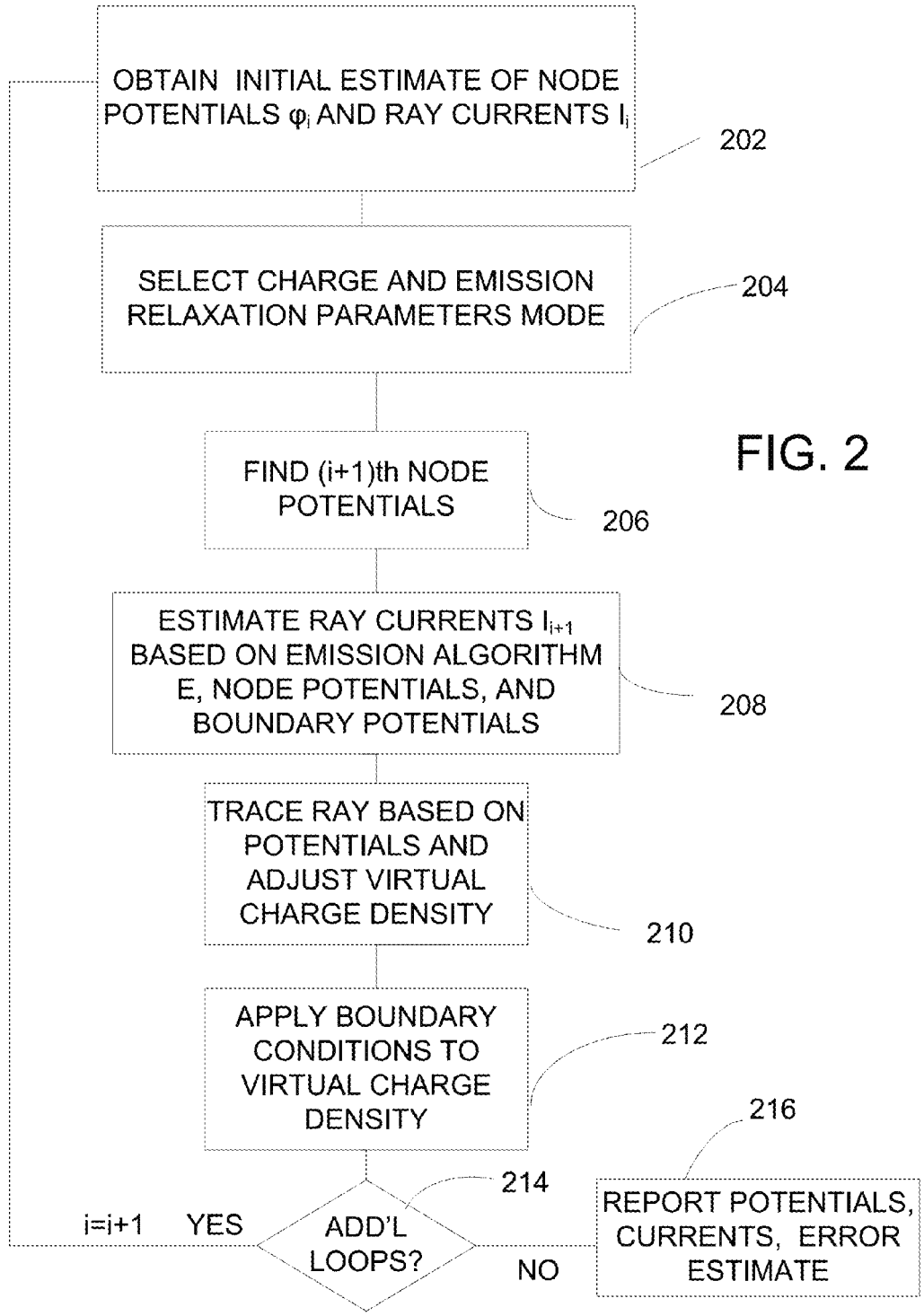
FIG. 2 illustrates an iterative calculation of node potentials and ray currents for a charged particle beam apparatus.

Determination of node potentials and currents is illustrated in FIG. 2. In a step 202, initial node potentials and ray currents are selected. In a first iteration (i=1), ray currents are typically set to zero, and node potentials $\phi_2$ are obtained from $P\phi_2 = Q_d$. In a step 204, values for emission and charge relaxation parameters s and r are selected, and in a step 206 node potentials in an $(i+1)^{th}$ iteration are obtained. In a step 208, ray currents are estimated, and in steps 210, 212 the discretized charge is updated based on ray tracing and application of boundary conditions. In a step 214, a determination is made if additional iterations are to be performed. If so, the process returns to the step 202, and the calculated values of the node potentials and currents are used as initial estimates. If additional iterations are not requested, the process concludes and an error estimate (either previously or newly computed) can be reported along with node potentials and currents in a step 216.

Figure 3:
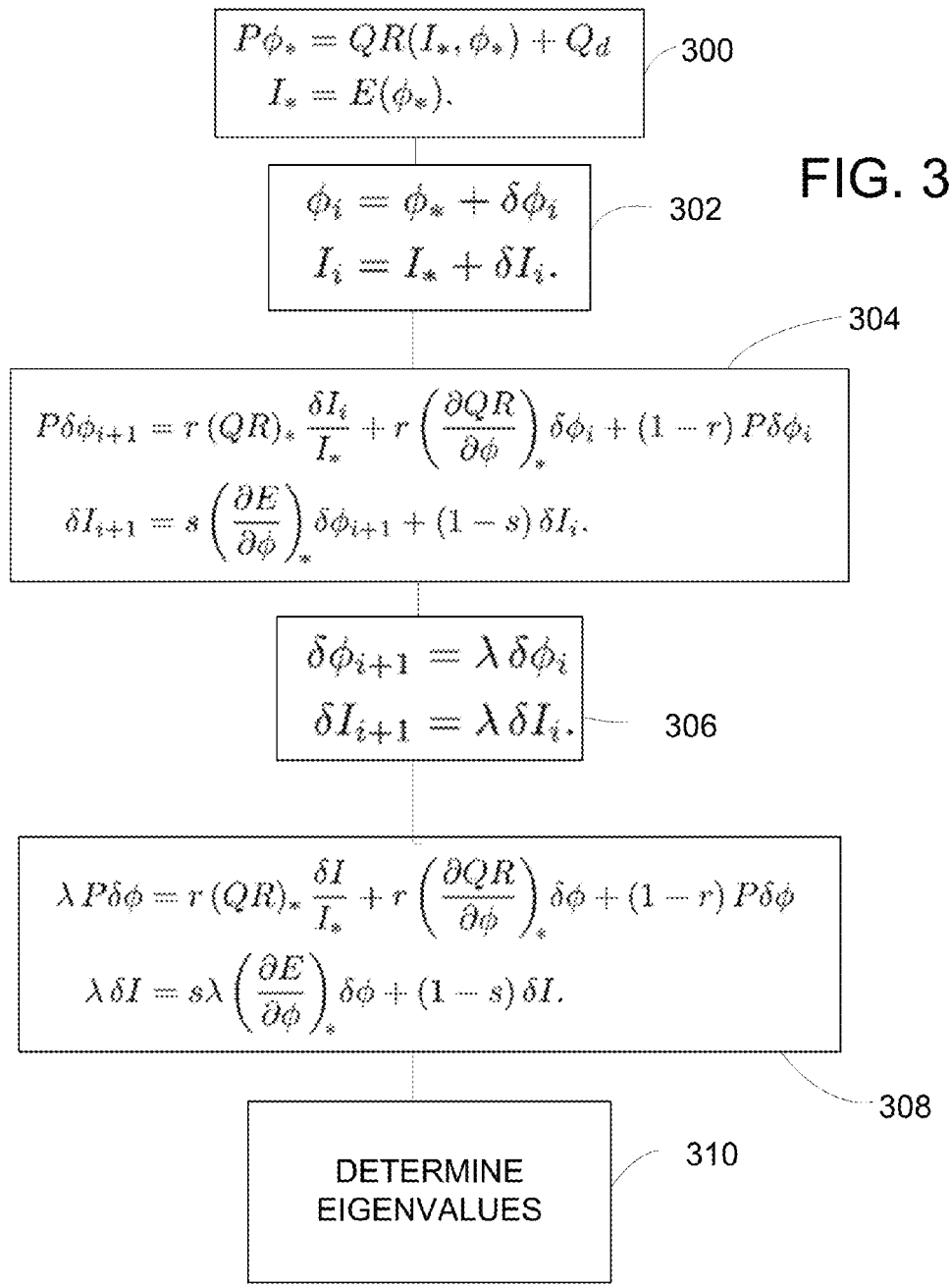
FIG. 3 illustrates a representative method of determining eigenvalues associated with error residuals in an interactive charged particle beam gun calculation.

In conventional analyses, relaxation parameters r and s are generally fixed values that are selected so that the iterative process shown in FIG. 2 converges. Surprisingly, particular selections of relaxation parameters can substantially improve convergence of the calculation of FIG. 2. FIG. 3 illustrates a representative method for selection of charge relaxation parameter values. In a step 300, self consistent solutions for interior node potentials and ray currents are represented as $\phi^*$, $I^*$, respectively. In a step 302, differences from the self-consistent solutions and the $i^{th}$ cycle solutions are defined as $\delta\phi_i$, $\delta I_i$. Linearized equations for the differences are provided in step 304. In a step 306, linearized eigenmode equations are established and generalized eigenvalue equations are defined in a step 308. In a step 310, solutions to the eigenvalue equations are obtained. The matrices used in the eigenvalue analysis typically have numbers of rows and columns that are equal to a sum of the number of interior nodes and the number of emitted rays. The eigenvalues can generally can be divided into two distinct groups as described below. Corresponding eigenvectors ($\delta\phi_i$, $\delta I_i$) can also be obtained. The eigenvectors can be used to provide specific error estimates for specific nodes, sets of nodes, emitted rays, or combinations thereof.

Figure 4A:
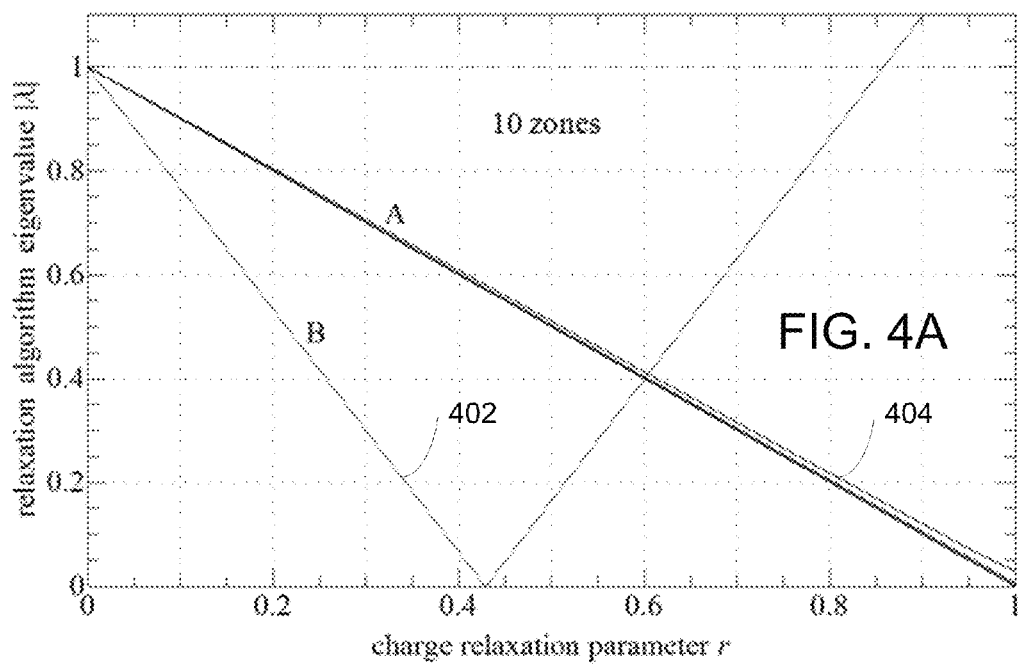
FIGS. 4A-4B are graphs illustrating representative calculations of A-mode and B-mode error residual eigenvalues.

Results of a representative eigenvalue computation as illustrated in FIG. 3 are shown in FIG. 4A. For this example, a 1-D parallel plate diode was modeled using a uniform mesh. Emission was modeled as space charged limited (Child's Law) in a zone nearest the cathode. Ten zones extending from cathode to anode were used, and the linearized eigenvalue calculations were performed exactly (non-iteratively) using MATHEMATICA mathematical computation software. For more complex geometries, other approaches to solving the linearized eigenvalue equations may be preferred. The values of FIG. 4A were obtained by varying the value of the charge relaxation parameter r, and then finding corresponding eigenvalues for each r-value. These eigenvalues are then divided into two groups of similar eigenvalues. For convenience, the eigenvalues of the groups are referred to as A-mode and B-mode eigenvalues $\lambda_A$, $\lambda_B$, respectively.

The absolute values of the estimated eigenvalues are plotted in FIG. 4A as a function of the charge relaxation parameter r. As shown in FIG. 4A, the A-mode eigenvalues are approximately equal to 1−r. The B-mode eigenvalues are represented by a single line 402 and the A-mode eigenvalues are represented by a series of adjacent lines 404. In some cases, the A-mode eigenvalues are complex values. Typically, the A-mode eigenvalues are relatively independent of mesh size. The B-mode eigenvalues are generally real and are substantially equal to 1−αr, wherein α is a slope parameter determined from the graph of FIG. 4A. The B-mode eigenvalues are generally dependent on the selected mesh size. Because per iteration error reduction is proportional to the eigenvalues ($\delta\phi_{i+1}=\lambda\delta\phi_i$ and $\delta I_{i+1}=\lambda\delta I_i$), eigenvalues near zero tend to produce superior convergence. For example, error associated with an A-mode eigenvalue $\lambda_A$ is substantially reduced or eliminated if the charge relaxation parameter is selected so that $\lambda_A$ is approximately zero, so that r is about 1. Similarly for error associated with B-mode eigenvalues, the charge relaxation parameter r can be selected so that 1−αr is approximately zero, or r is about 1/α. Eigenvalues having absolute values greater than 1 are associated with unstable calculations as errors tend to increase with each cycle. However, as discussed below, such unstable eigenvalues can be used in association with one or more stable eigenvalues.

FIG. 4A permits selection of charge relaxation parameter values so as to improve node potential and current calculations by selecting r-values so as to alternately substantially reduce A-mode errors and B-mode errors. In the FIG. 4A example, r-values can alternate between 0.42 and 1.0 (or vice versa) so as to reduce B-mode and A-mode errors (or A-mode and B-mode errors), respectively. Note that an r-value of 1.0 is by itself unstable (the eigenvalue for B-mode is greater than one), but if alternated with a lesser (stable) r-value (e.g., 0.43), the calculation still converges. For the FIG. 4A example, a largest stable r-value is 2/α or about 0.86. Thus, in one approach, r-values associated with A-mode errors and B-mode errors are alternately used in successive iterations of node potential and current determinations.

In another approach, an r-value can be selected to reduce A-mode and B-mode errors in each iteration in about the same proportion. For example, the magnitudes of A-mode and B-mode eigenvalues are about the same at an r-value of about 0.6. By selecting this r-value, both A-mode and B-mode errors can be reduced at similar rates. A suitable r-value can be determined from $\lambda_A=abs(\lambda_B)$, or 1−r=−(1−αr), i.e., r=2/(α+1).

In yet another approach, two or more r-values associated with a B-mode eigenvalue can be used. There can be a spread of B-mode eigenvalues and a corresponding distribution of r-values can be used. For example, if a preferred B-mode r-value is $r_B$, the values of $r_B+\delta$ and $r_B-\delta$ can be used. Thus, a sequence of r-values such as 1, $r_B+\delta$, $r_B-\delta$, . . . can be used. This approach is associated with changing the sign of the B-mode eigenvalues while still using an eigenvalue for which B-mode errors are substantially reduced. Typically, $\delta$ is less than about 0.1α, 0.2α, 0.3α and is chosen so that $r_B+\delta$ corresponds to a stable, converging potential and current calculation. For steeper slopes, smaller values of shift $\delta$ are used. However, as noted above, unstable r-values can be accommodated as well in combination with one or more stable r-values. In addition, while alternating a charge relaxation parameter between two values selected to alternately reduce A-mode and B-mode errors can be used, other combinations are also possible.

Figure 6A:
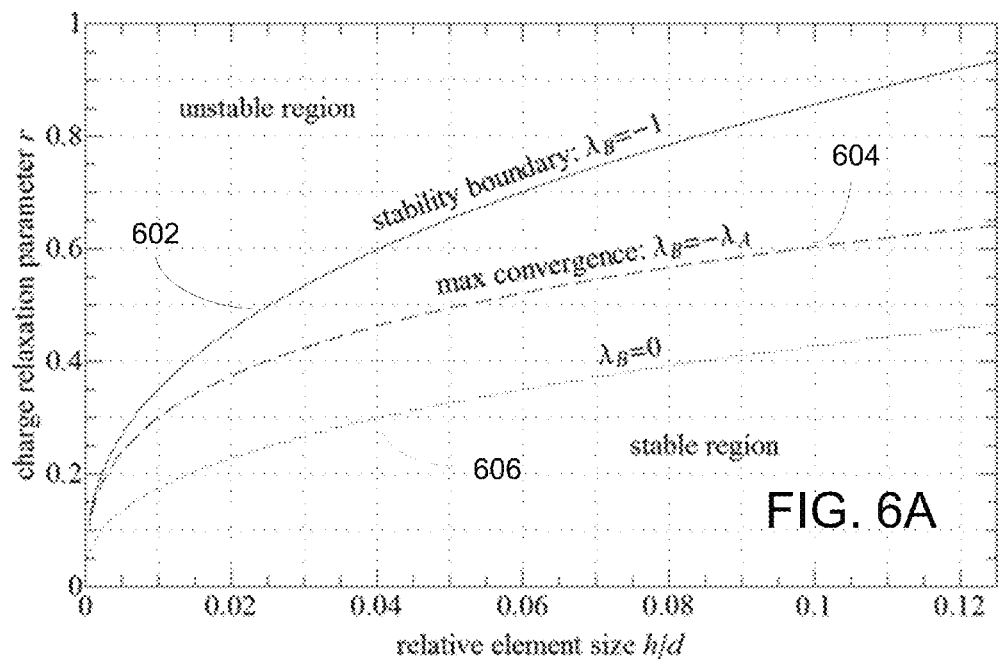
FIGS. 6A-6B are graphs illustrating stability boundaries associated with charged particle beam gun calculations based on selection of a charge relaxation parameter.
Figure 6B:
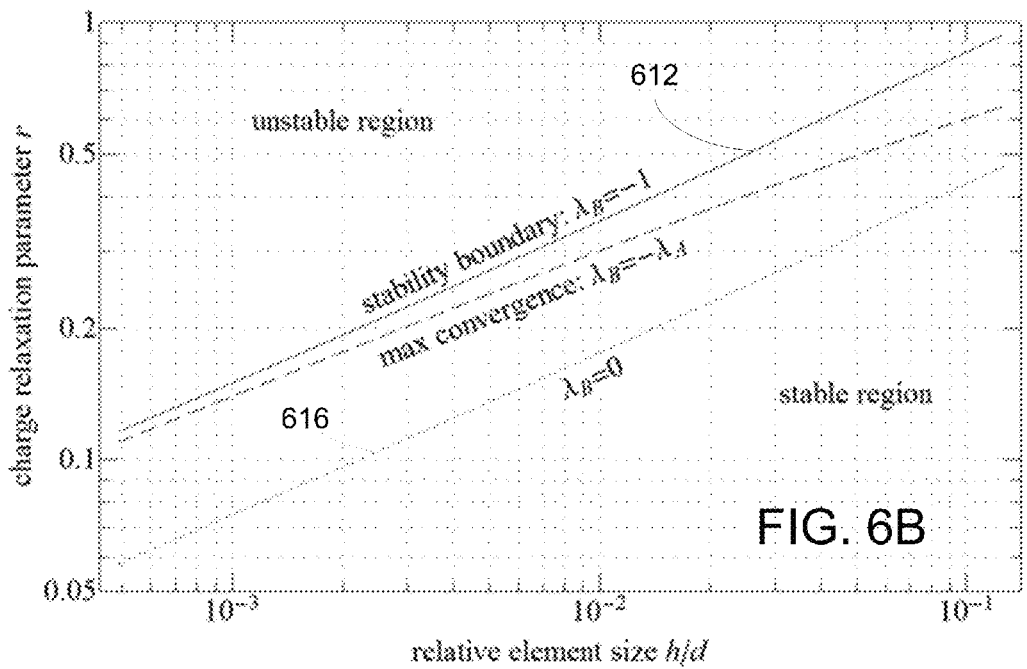

FIGS. 6A-6B illustrate stability considerations in conjunction with A- and B-mode eigenvalues for the 1-D geometry. As shown in FIG. 6A, stability boundaries are illustrated as a function of r-values and relative mesh element size (h/d), wherein h is an element size and d is an anode/cathode gap. A B-mode eigenvalue establishes a stability boundary 602, and a maximum convergence is obtained for A-mode and B-mode eigenvalues of the same magnitude along a curve 604. A maximum B-mode convergence rate occurs for values associated with a $\lambda_B=0$ curve 606. The selection of r-values depends on relative element size. FIG. 6B is similar to FIG. 6A but for considerably smaller ranges of (h/d) values. As shown in FIG. 6B, smaller (h/d) values are associated with smaller r-values for convergence.

Figure 5:
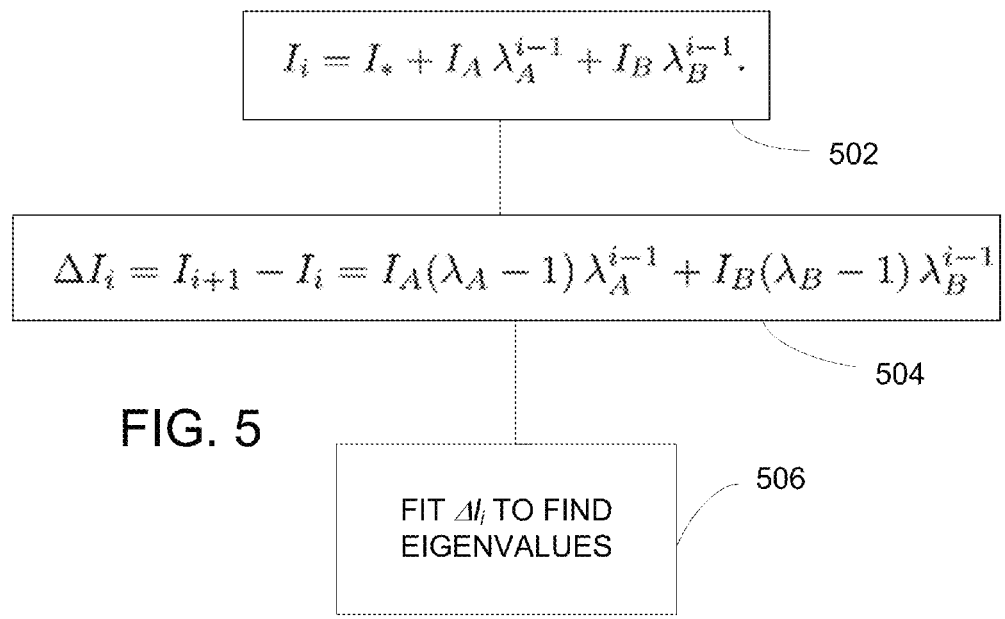
FIG. 5 illustrates a forward difference based method of estimating error residual eigenvalues.

Selection of charge relaxation parameter values can also be based on a forward difference equation as shown in FIG. 5. In a step 502, ray currents in an $i^{th}$ iteration $I_i$ are expressed as a function of a self consistent current I*, A-mode and B-mode ray currents $I_A$, $I_B$, and A-mode and B-mode eigenvalues $\lambda_A$, $\lambda_B$, respectively. In a step 504, the self consistent current I* is eliminated using a forward difference. In a step 506, the forward difference equation of step 504 is fit to find the eigenvalues $\lambda_A$, $\lambda_B$. The differences $\Delta I_t$ can be obtained from conventional finite element gun calculation programs such as MICHELLE. The fit procedure can be weighted nonlinear least squares, a linear prediction model such as weighted linear least squares followed by solution of a quadratic equation, or inspection of a plot of a ratio $\Delta I_{t+1}/\Delta I_t$.

Figure 4B:
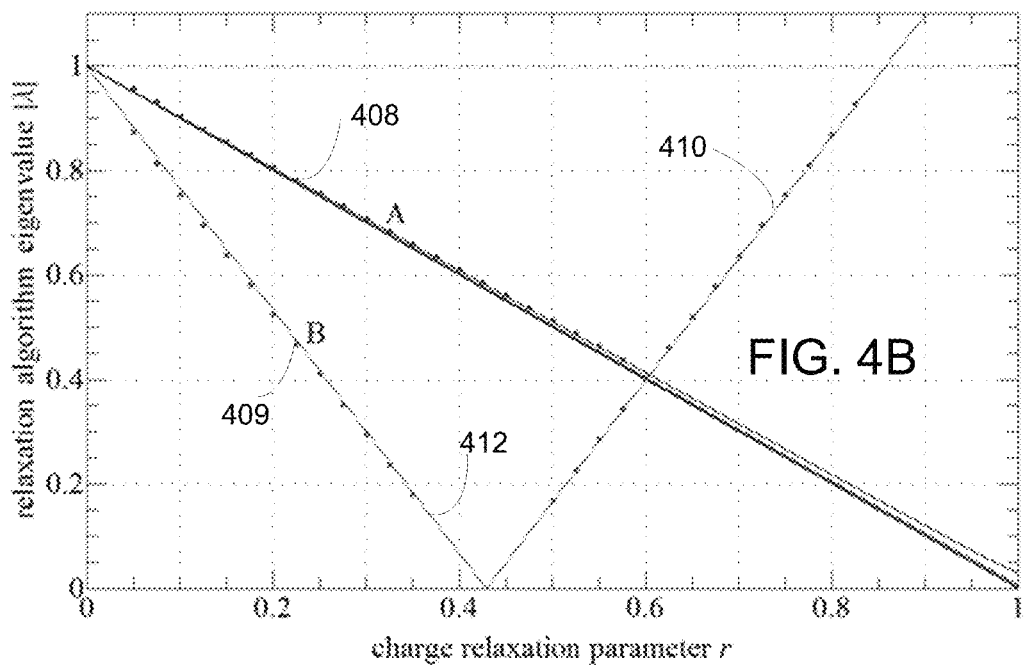

FIG. 4B illustrates a graph of eigenvalue magnitudes as a function of relaxation parameter based on the method of FIG. 5. The example of FIG. 5 is based on a 2-D uniform 10 by 10 zone parallel plate geometry. Each of the representative points (for example, 408, 409) on the A-mode curve 410 and the B-mode curve 412 for a common r-value are based on a calculation such as that illustrated in FIG. 5. The curves of FIGS. 4A-4B are substantially the same, indicating the eigenmode analysis is similar.

Figure 7A:
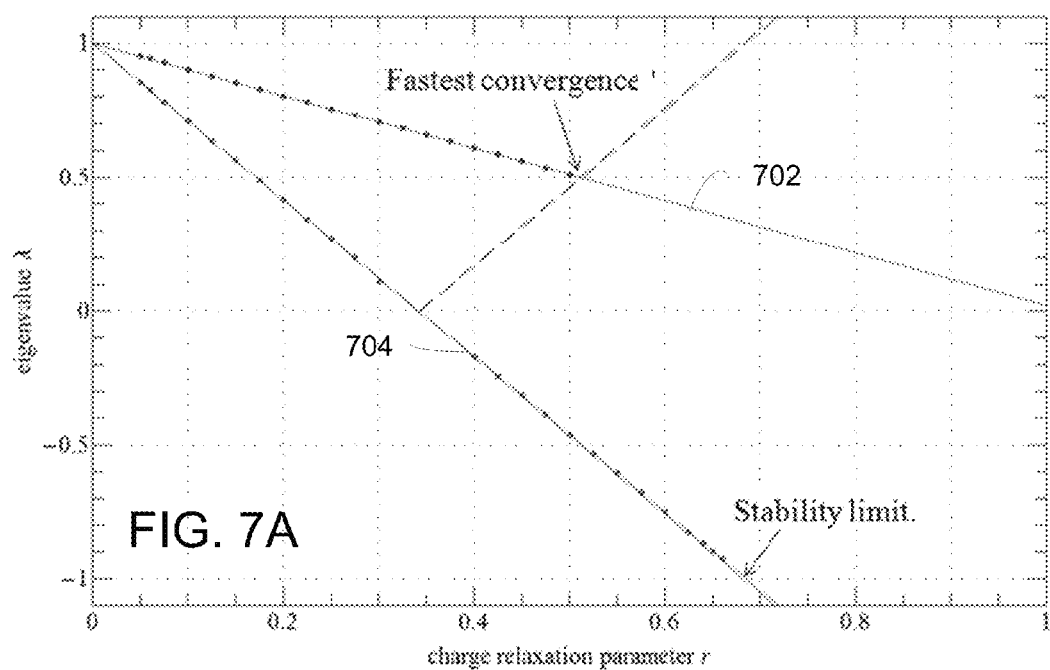
FIGS. 7A-7B illustrate eigenvalues associated with error residuals as a function of a charge relaxation parameter value.

In another example, the eigenvalue based approach was applied to a 3-D parallel plate diode with physical dimensions of 2.236 m by 2.236 m by 1 m, a mesh of 74462 tetrahedral elements and 13634 nodes, with nominal value of h/d=0.1. A cathode face was divided into 1251 triangular portions. Emission was modeled using a basic space-charge limited algorithm. For this example, a finite element gun code (MICHELLE) was used in computation of eigenvalues. As shown in FIG. 7A, A- and B-mode eigenvalue magnitudes are graphed as a function of r-value on respective curves 702, 704. A likely best single r-value is indicated, and A-mode and B-mode eigenvalues associated with r-values of about 1 and 0.35 appear to be suitable for reducing A-mode and B-mode errors. Calculations appear to be stable for r-values such that r is less that about $2.26(V/Nd^3)^{1/8}$, wherein V is mesh volume and N is a number of tetrahedral elements.

Figure 7B:
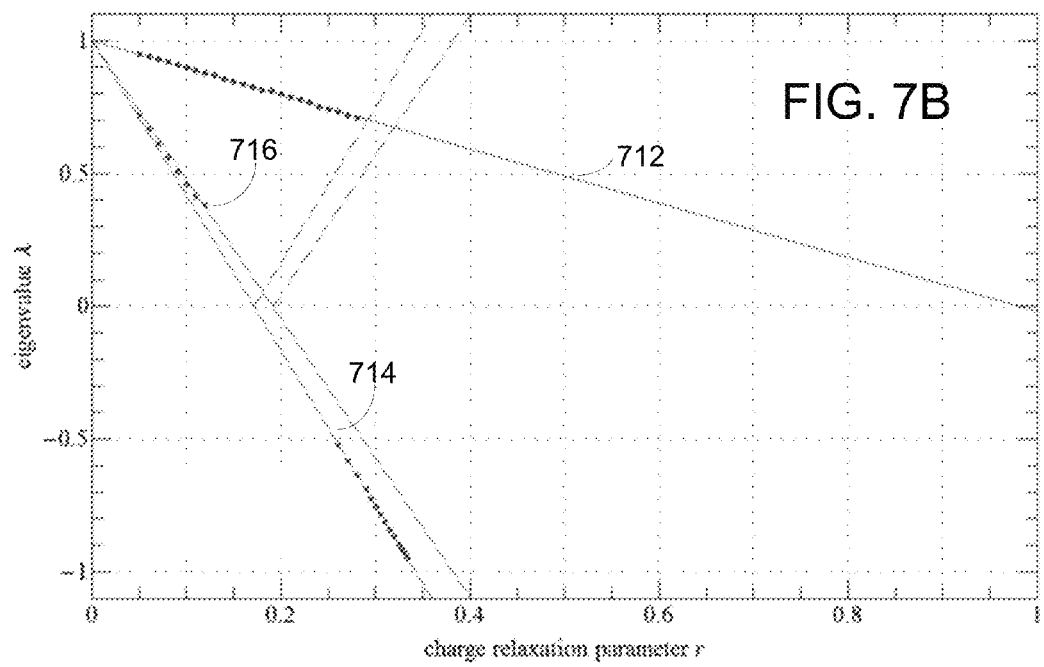

Results of a similar calculation based on a non-uniform multiblock structured mesh is illustrated in FIG. 7B. A mesh can be structured (a regular arrangement of quadrilaterals in 2-D or hexahedra in 3-D) or unstructured (an irregular arrangement of elements, typically triangles in 2-D or tetrahedra in 3-D). An A-mode curve 712 and a B-mode region 714 are shown, and each data point such as a representative point 716 corresponds to a single eigenvalue calculation. As shown in FIG. 7B, the B-eigenvalues appear to be spread, but a value of a can be estimated.

Figure 8:
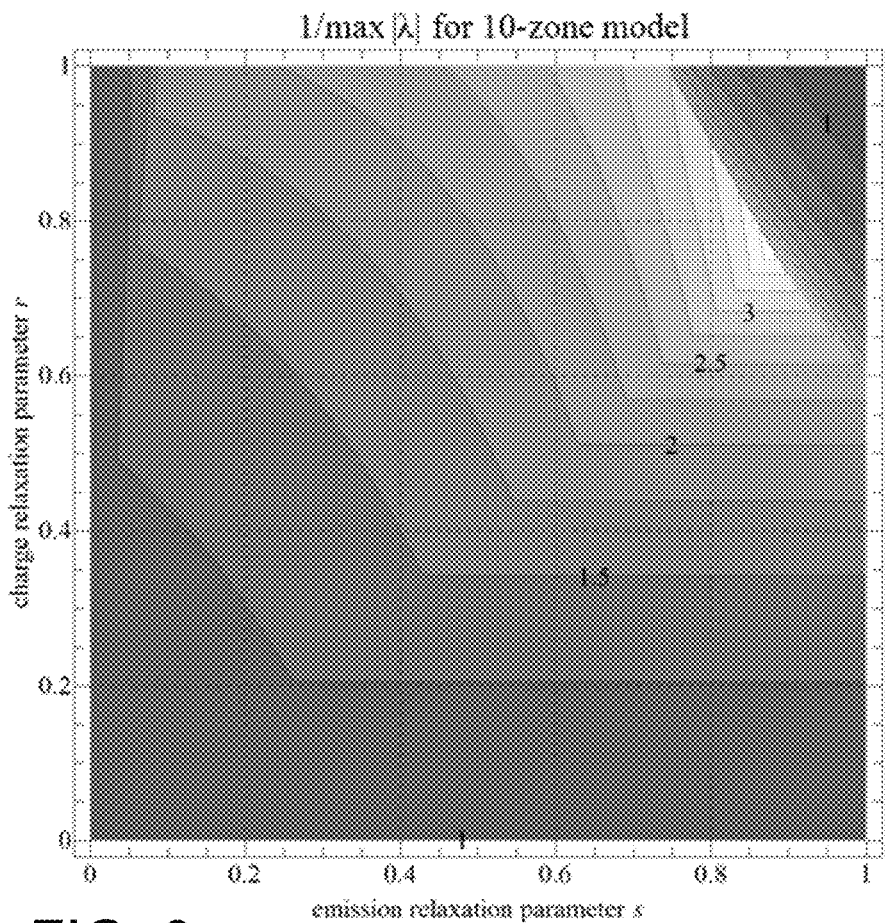
FIG. 8 illustrates rate of convergence of node potential values based on charge and emission relaxation parameters.

While in the examples above, only the charge relaxation parameter r is varied, in some examples, superior results can be obtained by varying the emission relaxation parameter s as well. FIG. 8 shows factors by which each cycle reduces error as a function of r and s for the 10 zone uniform parallel plate example described above. Thus, variation of either one or both of r and s can improve convergence. Selection of suitable s-values can be made based on an eigenvalue analysis as described above, and s-values can be alternated.

Figure 9:
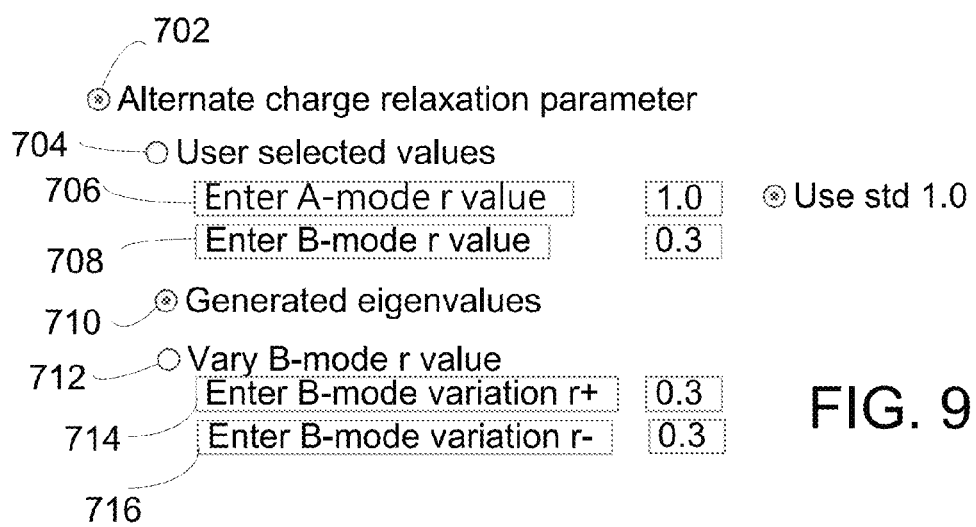
FIG. 9 illustrates a representative user interface that aids user selection of charge relaxation parameters selected to increase convergence rate in charged particle beam gun calculations.

Selection of suitable relaxation values can be conveniently provided with a user interface such at that shown in FIG. 9. As shown in FIG. 9, only r-values are selected, but s- and r-values and combinations thereof can be selected in a similar fashion. Typically, selections are indicated using a computer pointing device such as a mouse. A radio button 902 associated with alternating a charge relaxation parameter in successive iterations is provided, and is selected as shown. A radio button 904 is associated with manual entry of A-mode and B-mode r values. These values can be obtained based on an eigenvalue analysis, or determined in some other way. As shown in FIG. 9, a default value of an A-mode r-value is provided in an input field 906, but user entry of other values is permitted. An input field 908 is provided for entry of a B-mode r-value. In FIG. 9, a radio button 910 is selected so that eigenvalues and associated r-values are generated without additional user input, based on eigenvalue calculations as described above. A radio button 912 is provided for user selection of variable B-mode r-values, and input fields 916, 918 are provided for user entry of these values. In some examples, default values can also be provided.

Suitable relaxation values can also be selected based on scaling relationships such as illustrated in FIGS. 6A-6B. Curves 606, 616 correspond to $\lambda_B=0$ as a function of hid. Thus, given h/d, a suitable r-value can be determined graphically, or from a corresponding scaling relationship. For example, for the 1-D example of FIGS. 6A-6B, the B-mode value can be selected to corresponding to a stable value such as from the curves or as $r<2(h/d)^{3/8}=2/(n^{3/8})$, wherein n=d/h is a number of elements between the cathode and the anode. An optimum B-mode value can be similarly selected as well as combined values suitable for simultaneous reduction of A-mode and B-mode errors.

A display monitor is configured to display the user interface of FIG. 9, and additional menu items can be provided. Entries can be made by, for example, activating a mouse button with a mouse pointer displayed at a display region associated with the menu item, and a keyboard or other device can be used to enter numerical values.

Improved convergence available with the disclosed methods is illustrated in FIGS. 10A-10C for 1-D model calculations with 10, 20, and 50 elements. Referring to FIG. 10A, a curve 1002 illustrates per iteration error reduction as a function of a single, fixed r-value. A curve 1004 illustrates average per iteration error reduction obtained by alternating an r-value with 1. In FIGS. 10B-10C, fixed r-values are associated with the curves 1012, 1022 and alternating 1 and an r-value are associated with curves 1014, 1024. FIGS. 10A-10C correspond to convergence rate improvements of about 3.12, 2.94, and 2.79, respectively.

Having described and illustrated representative embodiments, it will be recognized that the illustrated embodiments can be modified in arrangement and detail without departing from such principles. For instance, elements of the illustrated embodiment shown in software may be implemented in hardware and vice-versa. Also, the technologies from any example can be combined with the technologies described in any one or more of the other examples. In view of the many possible embodiments to which the principles may be applied, it should be recognized that the illustrated embodiments are examples and should not be taken as a limitation on the scope of the invention. For instance, various components of systems and tools described herein may be combined in function and use. I therefore claim as my invention all subject matter that comes within the scope and spirit of these claims. Alternatives specifically addressed in these sections are merely exemplary and do not constitute all possible alternatives to the embodiments described herein.

I claim:

1. A method, comprising:
   establishing first values for a plurality of node potentials or ray currents defined with respect to a charged particle beam emission structure;
   based on the first values and at least a first relaxation value, with a computer, determining second values for the plurality of node potentials or ray currents based on a gun code; and
   based on the second values and at least a second relaxation value, determining third values for the plurality of node potentials or ray currents based on the gun code, wherein the first and second relaxation values are different.

2. A method, comprising:
   establishing first values for a plurality of node potentials or ray currents defined with respect to a charged particle beam emission structure;
   based on the first values and at least a first relaxation value, with a computer, determining second values for the plurality of node potentials or ray currents based on a gun code;
   based on the second values and at least a second relaxation value, determining third values for the plurality of node potentials or ray currents based on the gun code, wherein the first and second relaxation values are different; and
   selecting the first relaxation value and the second relaxation value based on eigenvalues associated with error residuals.

3. The method of claim 1, wherein the first relaxation value or the second relaxation value is associated with charge relaxation and has a value of about 1.

4. The method of claim 1, wherein the first and second relaxation values are associated with charge relaxation, and further comprising performing an error residual eigenvalue determination, and selecting the first relaxation value and the second relaxation value based on eigenvalues associated with error residuals.

5. The method of claim 4, further comprising determining a combined charge relaxation value associated with approximately equal reductions in error residual contributions associated with eigenvectors corresponding to the first and second relaxation values.

6. The method of claim 4, wherein node potentials or ray currents are determined by iterative application of the gun code and alternate application of the first relaxation value and the second relaxation value.

7. The method of claim 6, further comprising determining iterative node potentials or ray currents based on a first value and a second value of an emission relaxation parameter, wherein the first emission relaxation value and the second emission relaxation value are different.

8. The method of claim 2, further comprising storing in a computer readable storage medium or displaying on a display device at least some of the node potentials or ray currents.

9. At least one nontransitory computer readable storage medium containing computer instructions stored therein for causing a computer processor to perform a method, comprising:
- determining eigenvalues associated with error residuals in an evaluation of a charged particle beam emission structure using a gun code;
- associating the eigenvalues with at least a first group of eigenvalues and a second group of eigenvalues; and
- determining a combined charge relaxation value based on the first and second groups of eigenvalues so as to reduce error residuals associated with the first and second groups of eigenvalues substantially equally in a gun code iteration.

10. At least one nontransitory computer readable storage medium containing computer instructions stored therein for causing a computer processor to perform a method, comprising:
- determining error residuals associated with a first eigenvalue and a second eigenvalue and associated with estimation of node voltages or ray currents for a charged particle beam emission structure based on a gun code; and
- selecting a first relaxation parameter and a second relaxation parameter based on the determination.

11. The at least nontransitory one computer readable storage medium of claim 10, further comprising iteratively determining node potentials or ray currents defined with respect to a charged particle beam emission structure based on the first relaxation parameter and the second relaxation parameter.

12. The at least one nontransitory computer readable storage medium of claim 11, further comprising iteratively determining node potentials or ray currents defined with respect to a charged particle beam emission structure by alternately applying the first relaxation parameter and the second relaxation parameter to the iterations.

13. The at least one nontransitory computer readable storage medium of claim 12, wherein the relaxation values are associated with charge relaxation.

14. The at least one nontransitory computer readable storage medium of claim 12, wherein one of the first and second relaxation values is about 1.

15. The at least one nontransitory computer readable storage medium of claim 13, wherein the method further comprises determining a combined charge relaxation value associated with approximately equal reductions in error residual contributions associated with eigenvectors corresponding to the first and second relaxation values.

16. The at least one nontransitory computer readable storage medium of claim 13, wherein the method further comprises determining node potentials or ray currents based on the combined charge relaxation value and the gun code.

17. The at least one nontransitory computer readable storage medium of claim 13, wherein the method further comprises determining if a mesh size for the node potential or ray current has been changed, and if so, updating only one of the relaxation parameter values.

18. A method, comprising:
- displaying a user interface configured for selecting at least two relaxation parameters associated with electromagnetic field distributions in a charged particle beam emission structure, wherein the user interface includes a display region associated with an indication that at least one of the two relaxation parameters is to be determined by an eigenvector analysis; and
- with a computer processor, estimating the electromagnetic field distribution using a gun code and the selected relaxation parameters.

19. The method of claim 18, wherein the user interface includes display regions associated with each of the at least two relaxation values, and configured to receive parameter values at the display regions.

20. The method of claim 18, wherein the the two relaxation parameters are charge relaxation parameters.

* * * * *